(12) United States Patent
Cole et al.

(10) Patent No.: US 8,076,245 B2
(45) Date of Patent: Dec. 13, 2011

(54) MOS LOW POWER SENSOR WITH SACRIFICIAL MEMBRANE

(75) Inventors: Barrett E. Cole, Bloomington, MN (US); Robert E. Higashi, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 286 days.

(21) Appl. No.: 12/119,872

(22) Filed: May 13, 2008

(65) Prior Publication Data

US 2009/0283759 A1    Nov. 19, 2009

(51) Int. Cl.
*H01L 21/302* (2006.01)

(52) U.S. Cl. .. 438/689; 438/717; 438/734; 257/E21.217

(58) Field of Classification Search .................. 438/689, 438/717, 734; 257/E21.217
See application file for complete search history.

(56) References Cited

U.S. PATENT DOCUMENTS

| | | | |
|---|---|---|---|
| 2002/0102753 A1* | 8/2002 | Johnson et al. | 438/20 |
| 2005/0072924 A1* | 4/2005 | Wood et al. | 250/338.1 |
| 2006/0249384 A1* | 11/2006 | Kim et al. | 204/424 |

* cited by examiner

*Primary Examiner* — Matthew Smith
*Assistant Examiner* — Elias Ullah
(74) *Attorney, Agent, or Firm* — Schwegman, Lundberg & Woessner P.A.

(57) ABSTRACT

A metal oxide semiconductor (MOS) device includes a substrate, a lower sacrificial membrane adjacent to the substrate, an upper thin film structure adjacent to the lower membrane, and a MOS material deposited on the upper thin film structure.

20 Claims, 13 Drawing Sheets

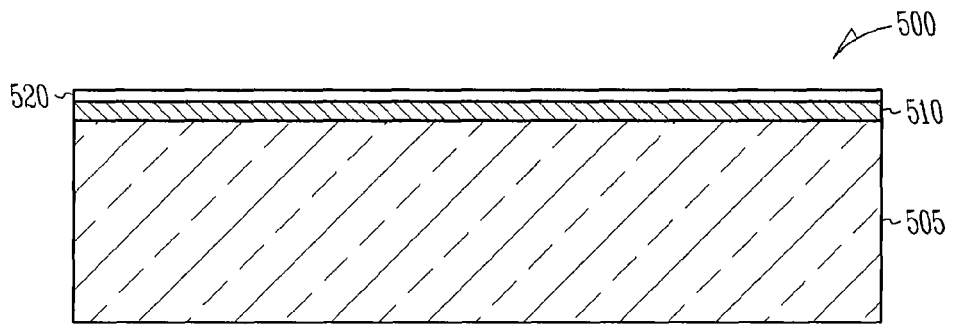
*FIG. 5A1*
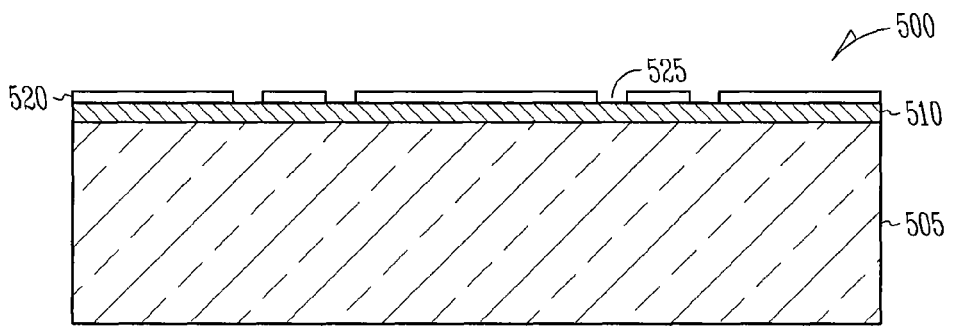
*FIG. 5A2*
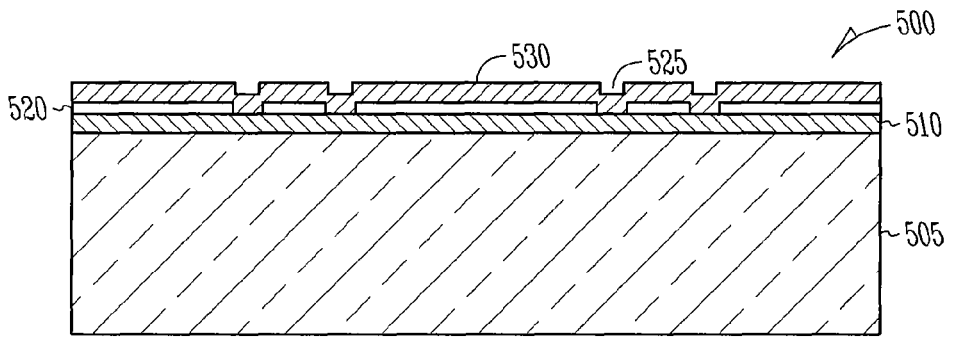
*FIG. 5A3*
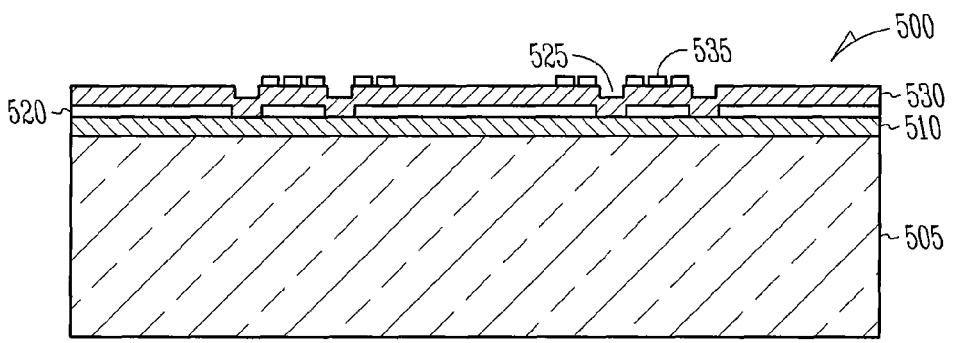
*FIG. 5A4*

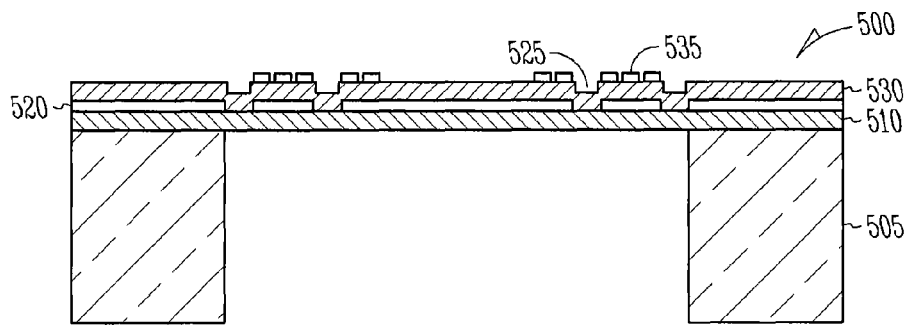
FIG. 5A5
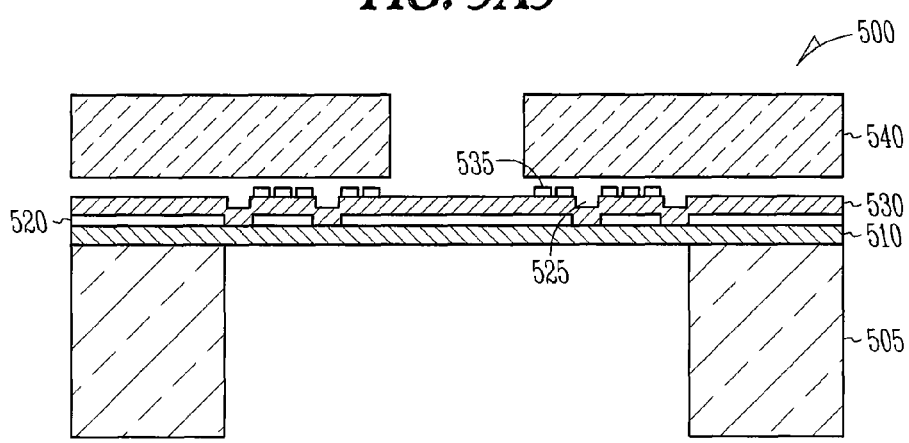
FIG. 5A6
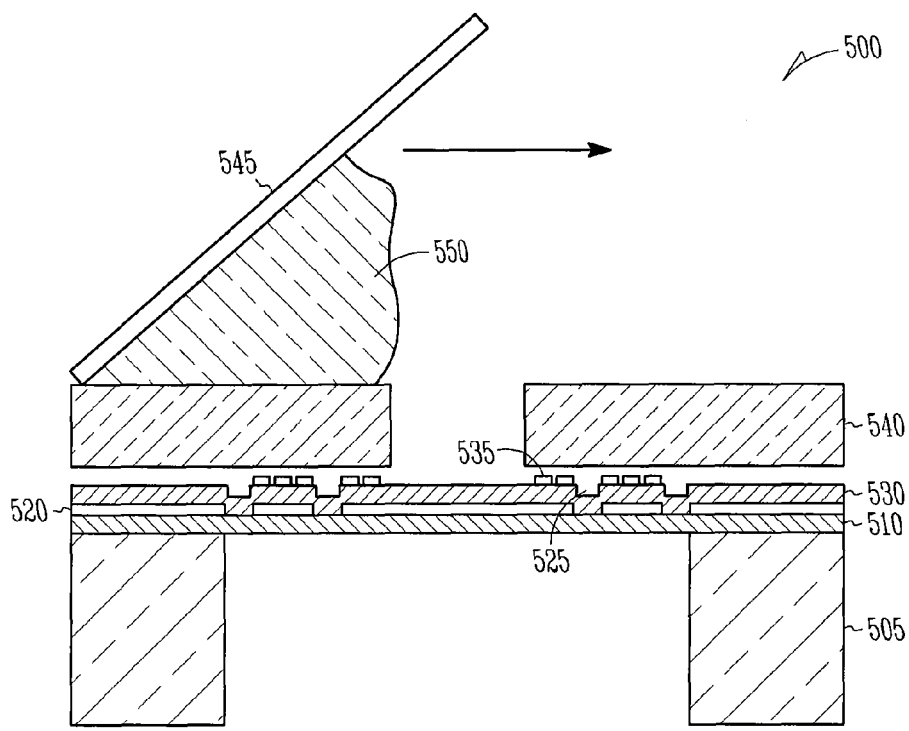
FIG. 5A7

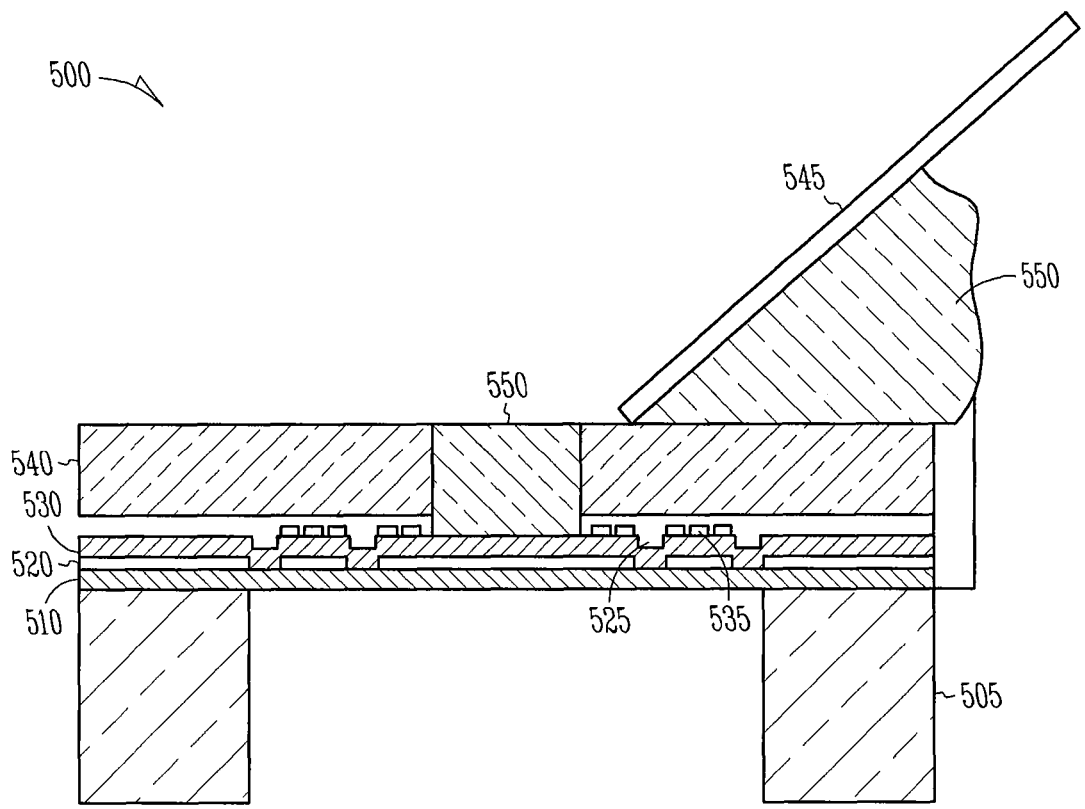
FIG. 5A8
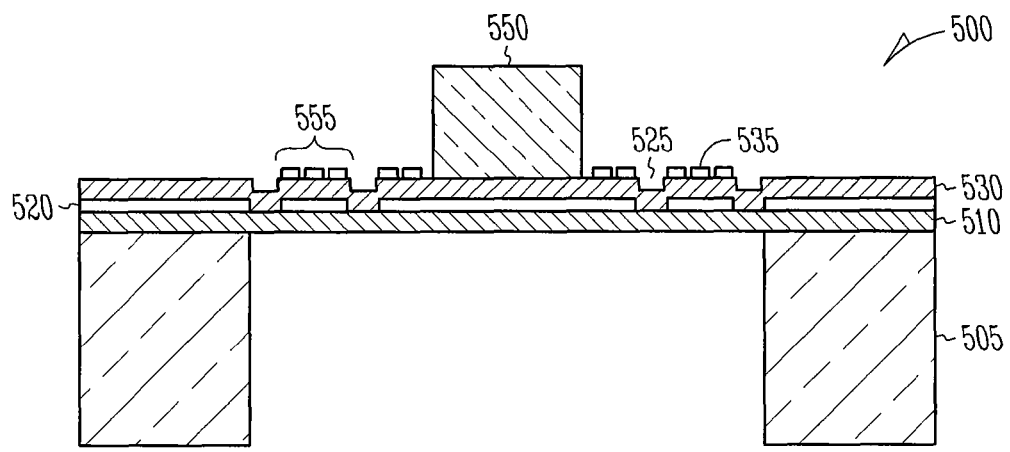
FIG. 5A9

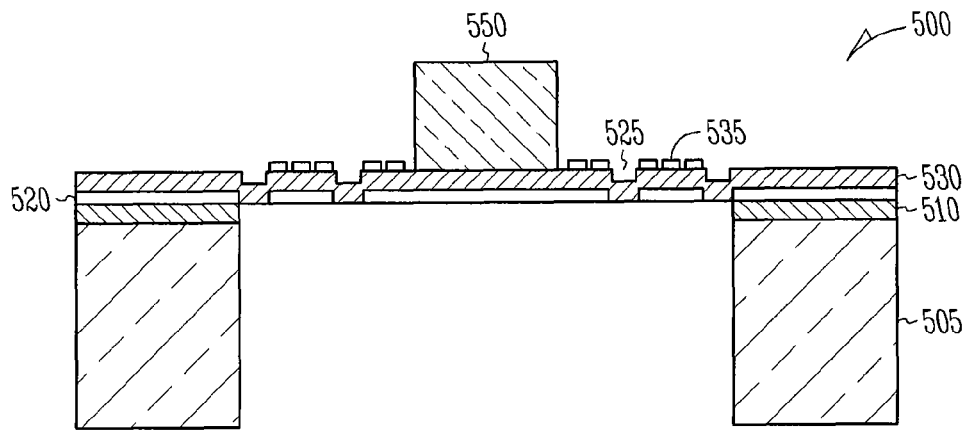
*FIG. 5A10*
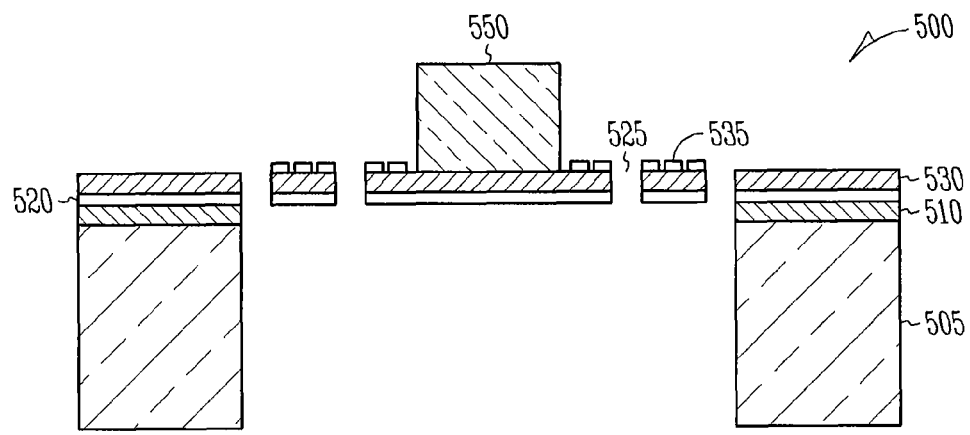
*FIG. 5A11*
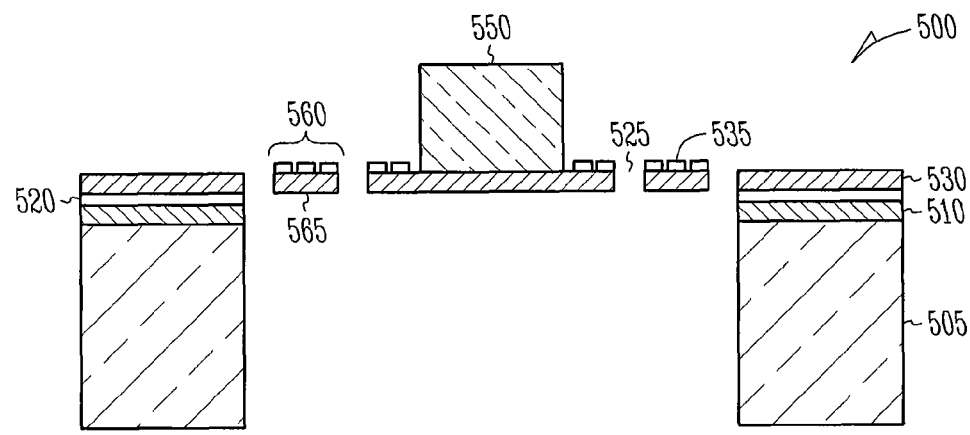
*FIG. 5A12*

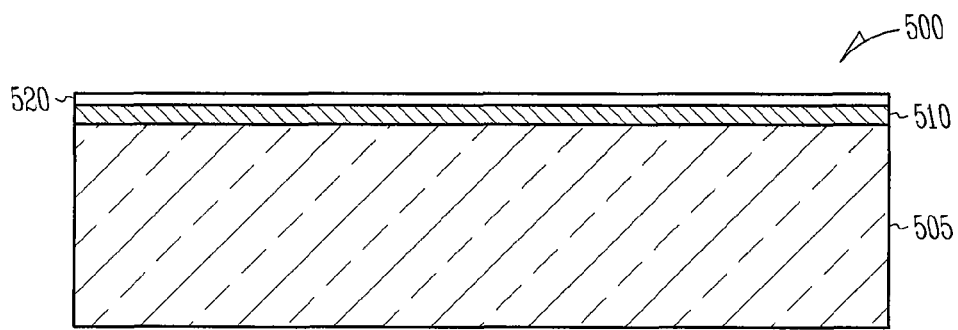
*FIG. 5B1*
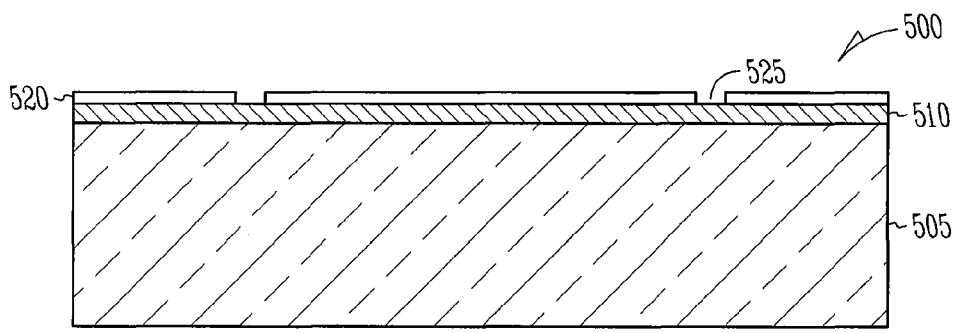
*FIG. 5B2*
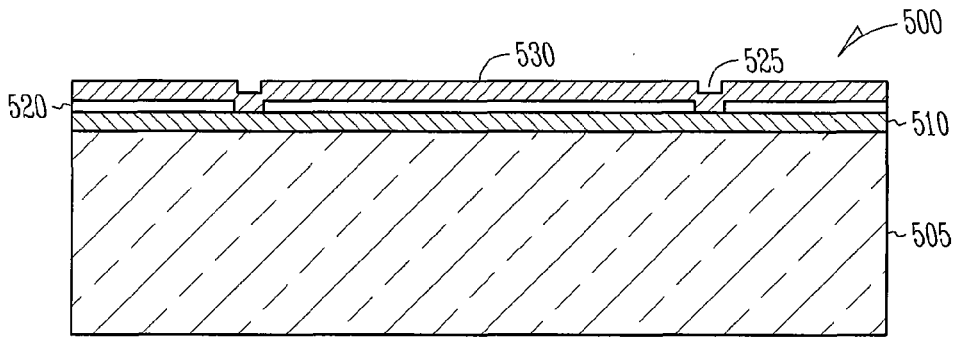
*FIG. 5B3*
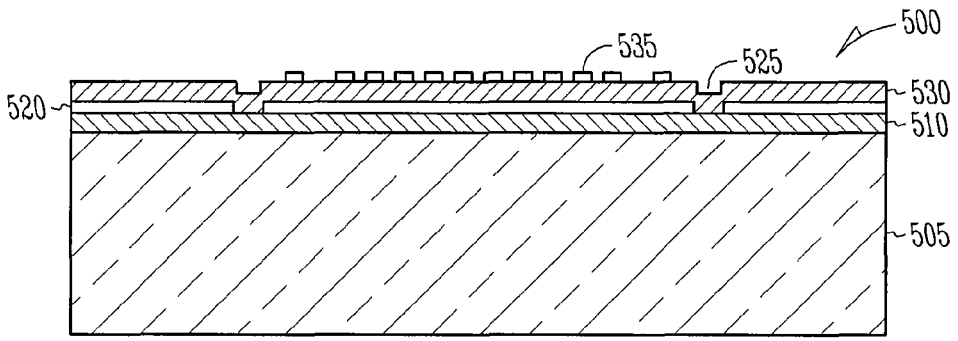
*FIG. 5B4*

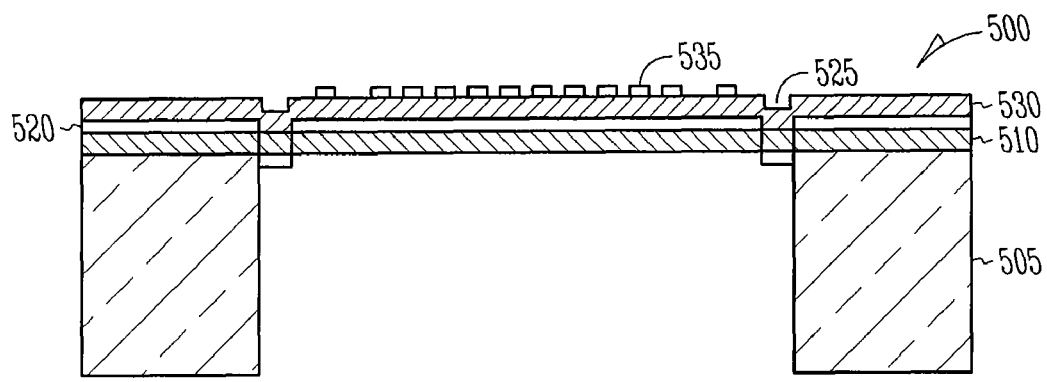
FIG. 5B5
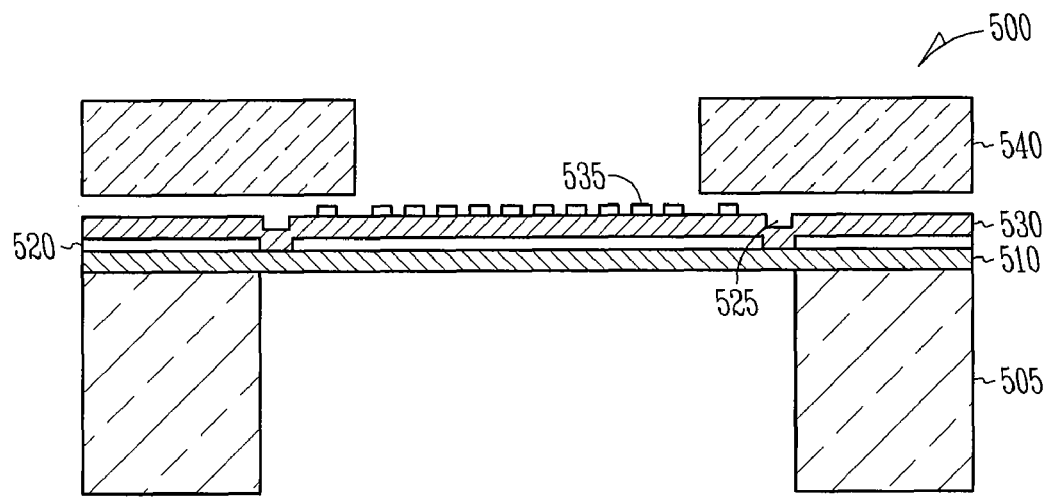
FIG. 5B6
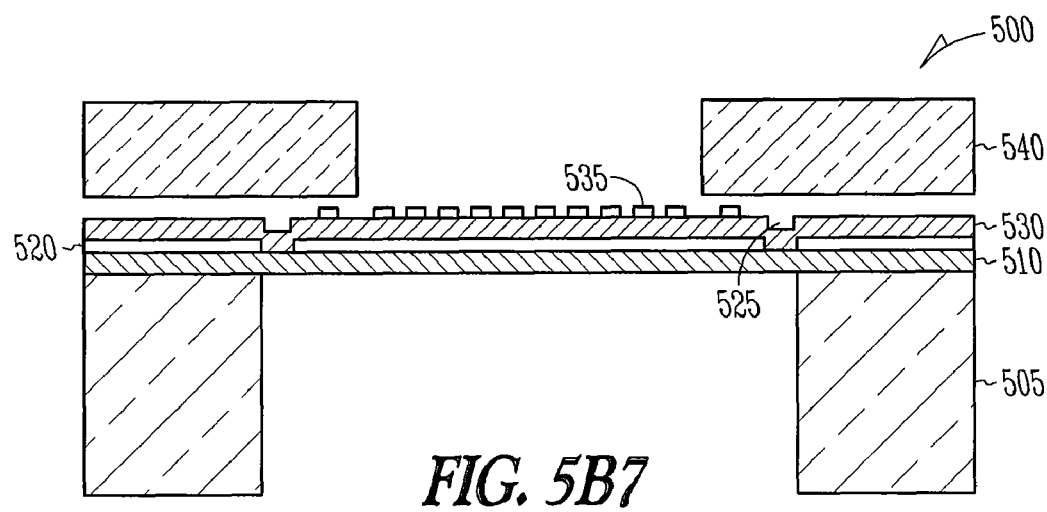
FIG. 5B7

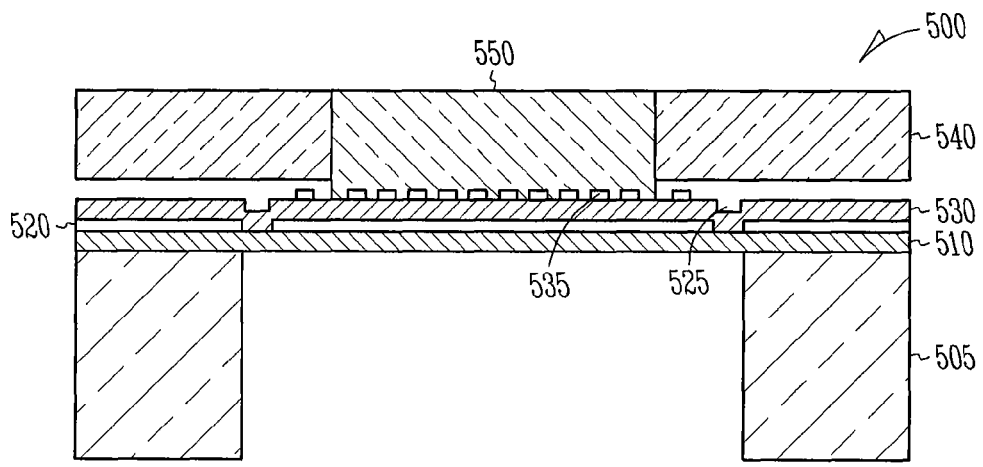
FIG. 5B8
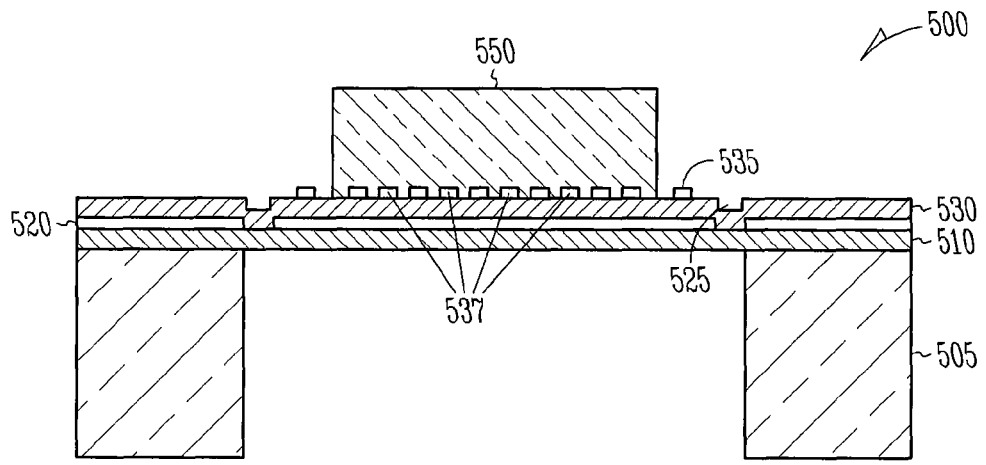
FIG. 5B9
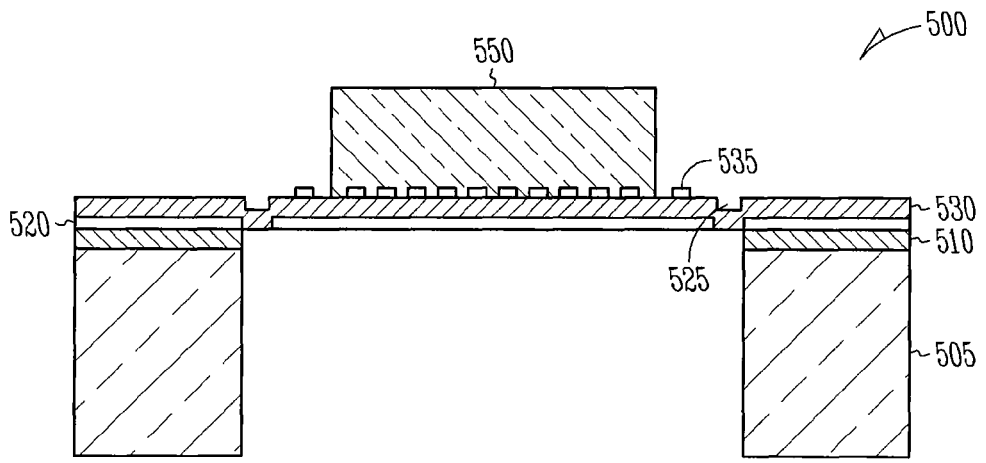
FIG. 5B10

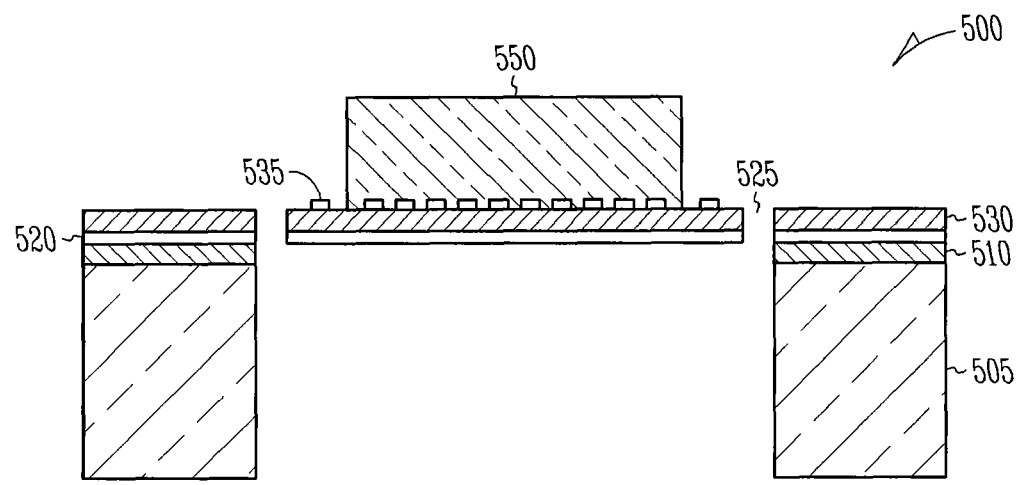
FIG. 5B11
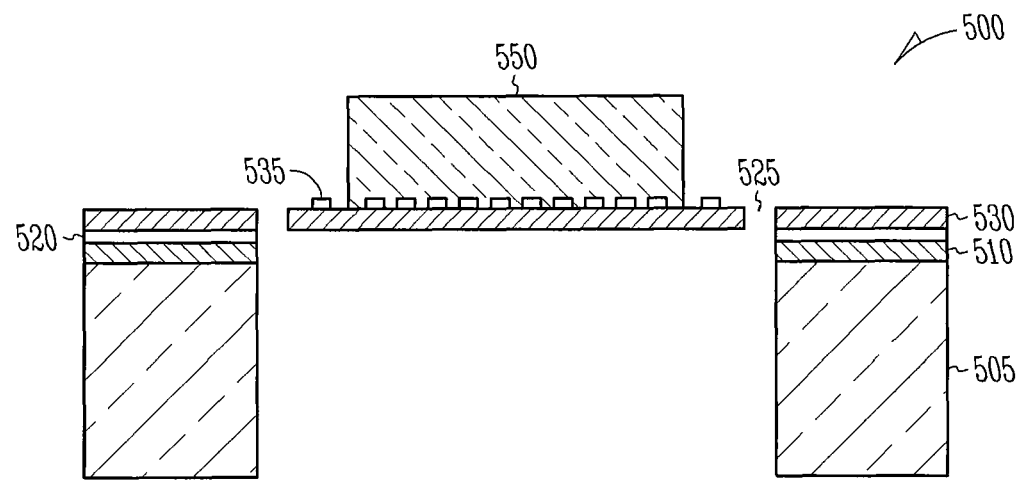
FIG. 5B12

MOS LOW POWER SENSOR WITH SACRIFICIAL MEMBRANE

TECHNICAL FIELD

Various embodiments relate to a metal-oxide semiconductor (MOS) device, and in an embodiment, but not by way of limitation, a MOS sensor with a sacrificial membrane.

BACKGROUND

Metal-oxide semiconductor (MOS) sensors are normally heated to temperatures of up to 300-400° C. for best sensing. At these temperatures, the material is most reactive. In order to drive off the binder and stabilize the sensor, it is usually necessary to anneal the material to much higher temperatures somewhere in the range of about 900° C. This requires power, which of course increases the costs of production.

When making such MOS devices, MOS materials can be applied to a sensor membrane by a number of techniques such as ink jet printing and screen printing, but stencil printing is preferred because it permits the material to be better formed into a pattern and it maintains the sensing material closer to "bulk" like sensing properties. Using a membrane is more efficient than applying the material to a low conductance substrate, but it does not provide sufficient efficiency for the low power requirements and high temperature required in a range of applications. On the other hand, if the membrane is made more efficient with spiders or legs, the MOS material cannot be stencil printed thereon because the spiders or legs render the membrane less rigid. Alternatively, the MOS device can be made by forming the membrane at the end, but this is difficult because it requires making a device that provides potassium hydroxide (KOH) etch protection or is compatible with reactive ion etch (RIE) instruments.

The art is therefore in need of a novel MOS device and a process of making such a MOS device to address these issues.

BRIEF DESCRIPTION OF THE DRAWINGS

FIGS. 5A1-5A12 and FIGS. 5B1-5B12 illustrate another example embodiment of a fabrication of a metal oxide semiconductor (MOS) sensor.

DETAILED DESCRIPTION

Figure 1A:
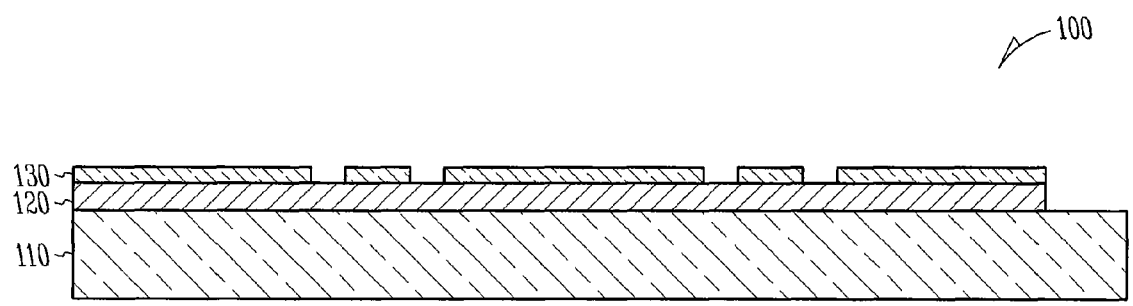
FIGS. 1A-1F illustrate an example embodiment of a fabrication of a metal oxide semiconductor (MOS) sensor.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

One or more figures show block diagrams of systems and apparatus of embodiments of the invention. One or more figures show flow diagrams illustrating systems and apparatus for such embodiments. The operations of the one or more flow diagrams will be described with references to the systems/apparatuses shown in the one or more block diagrams. However, it should be understood that the operations of the one or more flow diagrams could be performed by embodiments of systems and apparatus other than those discussed with reference to the one or more block diagrams, and embodiments discussed with reference to the systems/apparatus could perform operations different than those discussed with reference to the one or more flow diagrams.

In general, there are three power loss mechanisms in a thermal device. Heat can be lost via conduction, radiation, and/or convection (e.g., via air flow over a hot MOS device). Convection and radiation are dependent on the heated area of the device. Radiation is a non-linear loss mechanism and becomes dominant at very high temperatures, somewhat higher than the temperature levels of MOS device production. Conductance can be both through the air to a cold surface and through a solid material in contact with the heated area. Conductance through solid material is usually much higher unless it is very thin or patterned to have a small cross-section, and then air conductance can sometimes dominate the loss. To achieve minimal power in the production of a MOS device, it is most helpful to reduce all power losses. To reduce conductance heat loss, it is desirable to make the device as small as possible and maintain poor thermal contact between the heated area and the surrounding solid elements.

A first step in reducing power loss is to minimize the conductance through the solid material that supports the device. In one or more embodiments disclosed herein, legs are used to serve this function while still providing electrical and support contact to the surrounding solid elements. Consequently, in one or more embodiments, the power required to make MOS devices can be reduced by forming the sensing material as part of a microstructure that has lower thermal conductance.

In an embodiment, a metal-oxide semiconductor (MOS) material is applied to a robust structure, and the final structure (e.g., a MOS sensor) is formed via the removal of a sacrificial membrane (which is part of the robust structure). The removal of the sacrificial membrane results in a sensor that has improved thermal properties over a device with a full membrane—that is, the sensor requires less power and there is less thermal conductance in the sensor.

Such a MOS device can include two membranes of different material. A lower membrane provides strength to permit stencil printing of the MOS material onto the completed device. An upper thin film structure is the basis for the final structure (e.g., a spider design to couple the MOS sensing material to a processor). Towards the end of the fabrication process, the lower membrane is removed. The removal of the lower membrane results in a MOS sensor that requires less power. Additionally, the flimsier spider membrane requires less power because there is not as much thermal conduction as in a studier membrane.

To produce such a device, in an embodiment, a three step process includes forming a dual membrane structure (the lower membrane and the upper thin film structure), applying a MOS material through a stencil, and using etch removal of the lower membrane to form the final device.

The MOS sensor and the process to fabricate it have several advantages. First, the dual membrane provides a robustness that is conducive to stencil printing. Second, the process overcomes the difficulty in stencil printing MOS material onto a non-continuous membrane. Third, the process only requires etch removal of the supporting membrane after the application of a MOS material to make the final sensor device. Fourth, all back side processes (e.g., formation of the lower membrane and the upper thin film structure) are achieved before the MOS material is applied. Fifth, a variety of sacrificial membranes can be used. Sixth, the fabricated sensor device has improved thermal properties over a full membrane device—that is, lower power and lower thermal conductance.

Figure 1B:
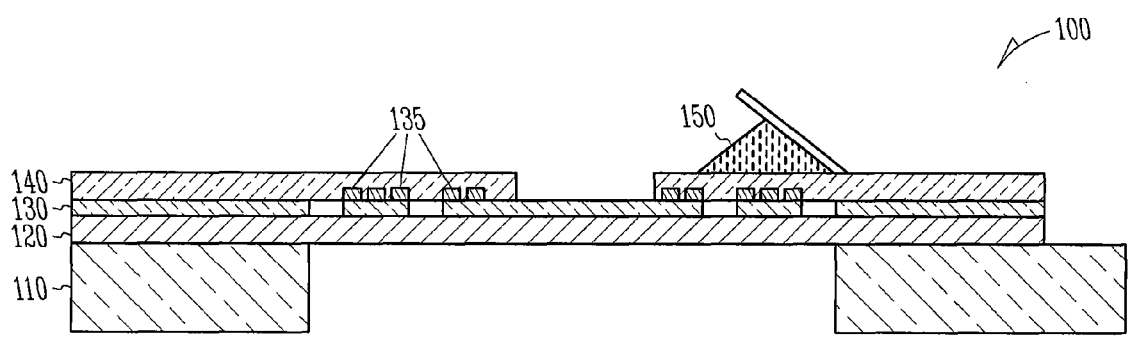
Figure 1C:
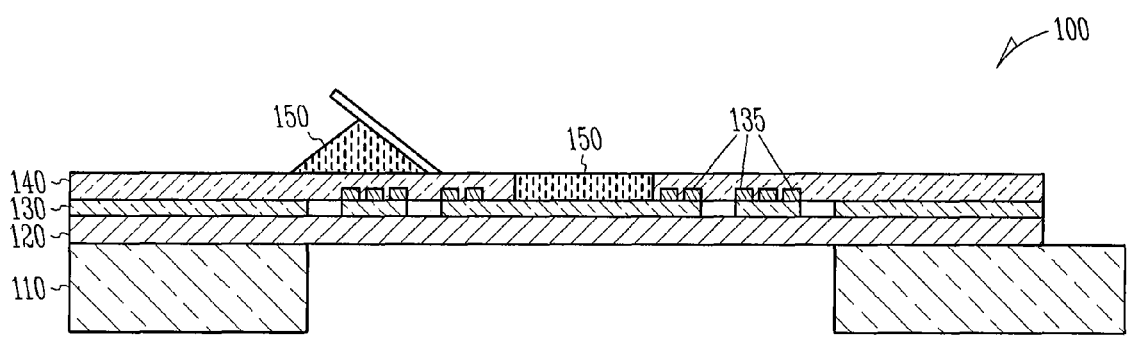
Figure 1D:
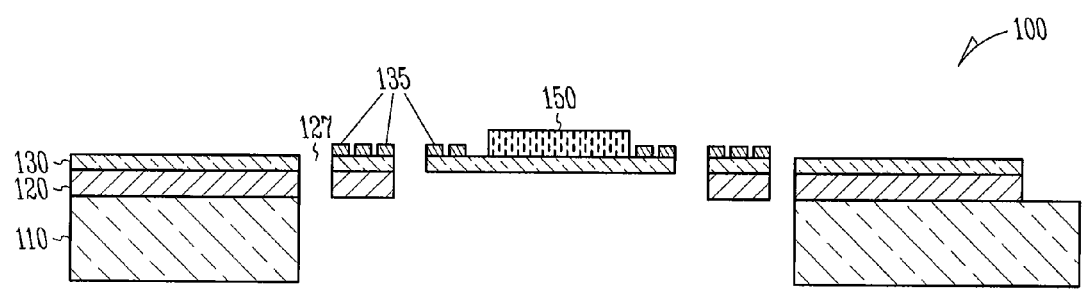
Figure 1E:
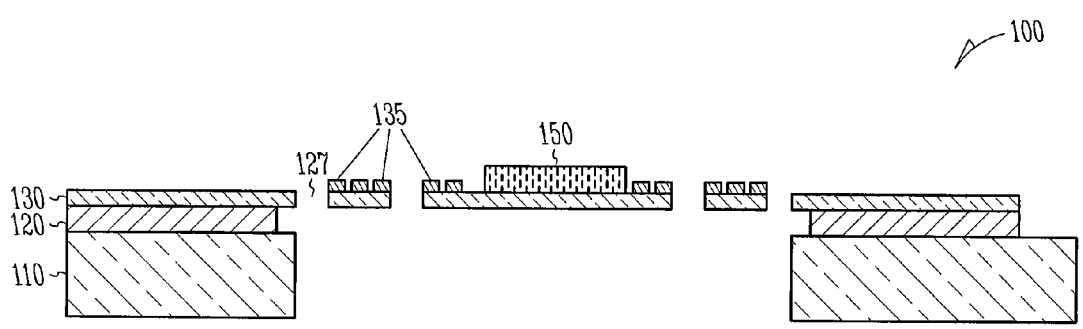
Figure 1F:
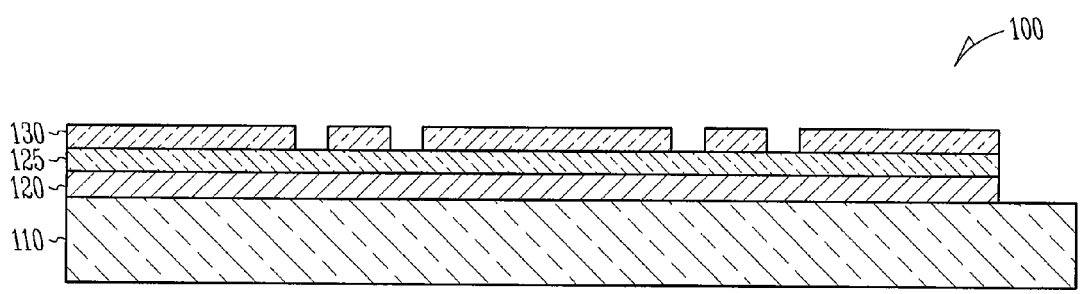
Figure 2A:
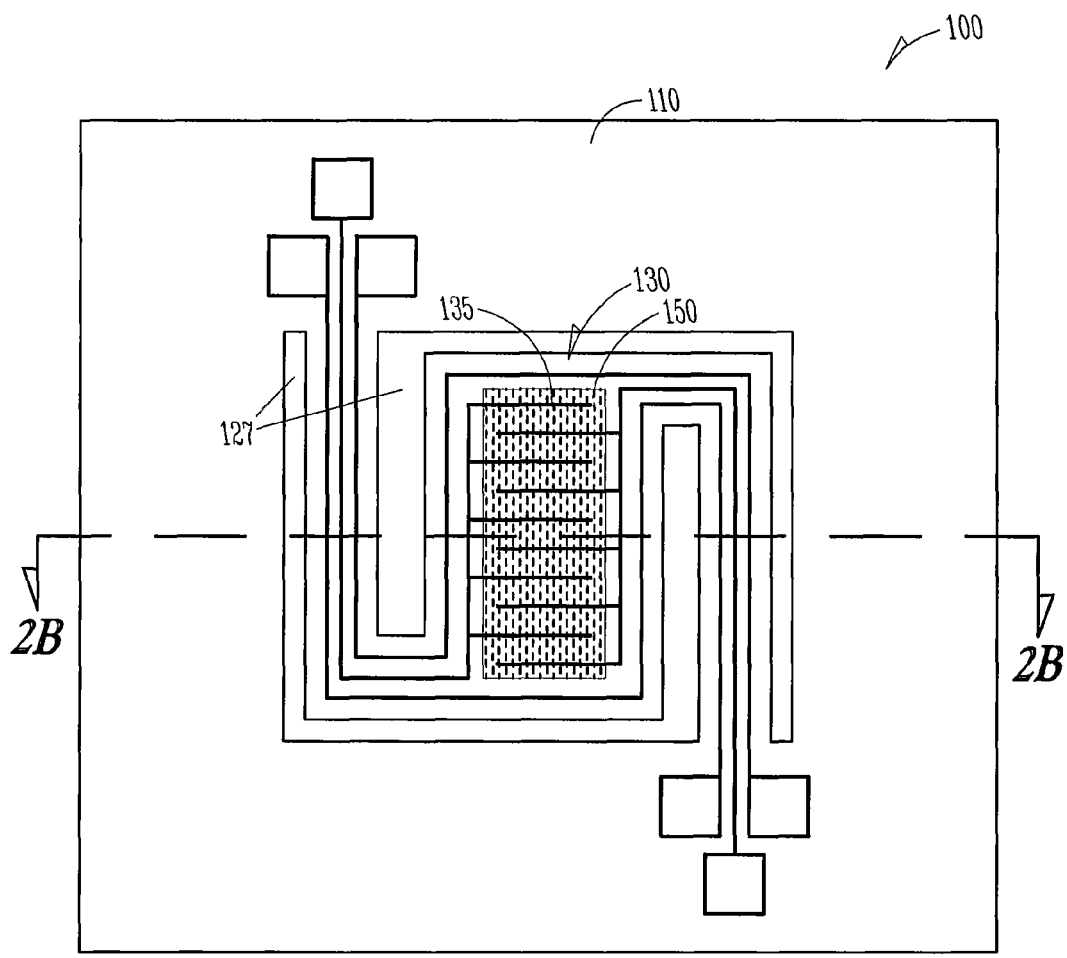
FIG. 2A is a plan view of an example embodiment of a MOS sensor.
Figure 2B:
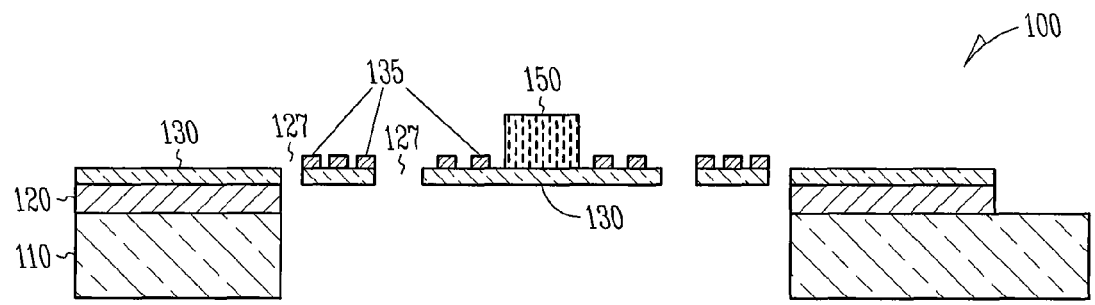
FIG. 2B is a cross sectional view along line 2B-2B of FIG. 2A.
Figure 3A:
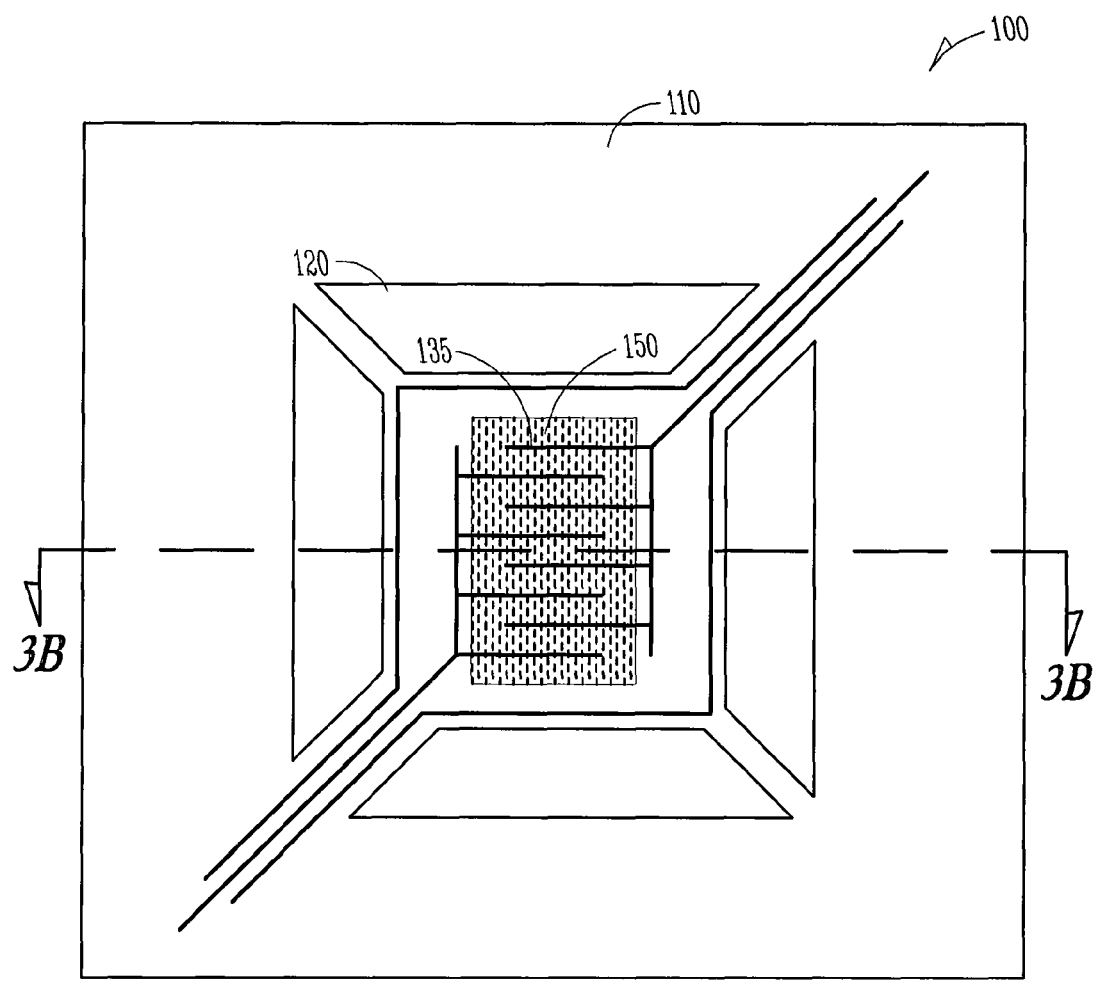
FIG. 3A is a plan view of another example embodiment of a MOS sensor.
Figure 3B:
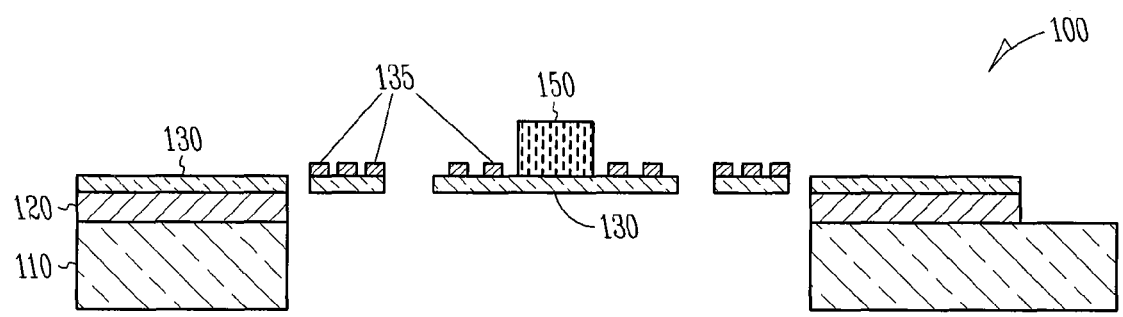
FIG. 3B is a cross sectional view along line 3B-3B of FIG. 3A.

FIGS. 1A-1F illustrate a MOS low power sensor with a sacrificial membrane and the process steps employed to fabricate it. Referring to FIG. 1A, the MOS low power sensor 100 includes a substrate 110, a lower membrane 120, and an upper thin film structure 130. The lower membrane 120 and the upper thin film structure 130 can be fabricated from silicon dioxide ($SiO_2$), silicon nitride ($Si_3N_4$), or other suitable materials. To fabricate a device in which the lower membrane 120 and the upper thin film structure 130 are the same material, it is preferable to include a metal layer 125 between the lower membrane 120 and the upper thin film structure 130 as illustrated in FIG. 1F. The substrate 110 can be silicon. The lower membrane 120 provides strength and support for a MOS paste application process such as a MOS stencil printing. While FIGS. 1A-1F are not drawn to scale, it can be seen in these figures that the lower membrane 120 is thicker than the upper thin film structure 130. In an embodiment, the lower membrane 120 can range in thickness from approximately 1 to 100 µm, and the upper thin film structure 130 can range in thickness from approximately 75 to 2000 nm. The upper thin film structure 130 can be a spider structure, and can serve as a support for the circuit elements 135 to transmit signals.

FIGS. 1B and 1C show that a portion of the substrate 110 has been etched away. The silicon is etched away so that there is less substrate to act as a heat sink, which would increase the power required to fabricate the device. An appropriate stencil 140 is then placed on the upper thin film structure 130. After the stencil 140 is in place, a MOS paste 150 can be applied to the upper thin film structure 130 via the stencil 140. The lower membrane 120 provides support for the somewhat rough stencil printing process. The MOS paste 150 can include tungsten oxide or chromium titanium oxide.

FIG. 1D shows the MOS sensor 100 after the removal of the stencil 140. FIG. 1D further illustrates that the lower membrane 120 and the upper thin film structure 130 have been etched. The etching of the upper thin film structure 130 creates holes 127 within the upper thin film structure 130, thereby creating a spider design circuit. The spider upper thin film structure 130 and electrode features 135 serve to provide an electrical connection between the MOS paste resistor 150 and a processor or other device. FIG. 1E shows further etching of the lower membrane 120. The etching of the lower membrane 120, like the removal of the substrate 110 in FIG. 1A, removes material that can serve as a heat sink, thereby increasing the power that the device requires to operate. After the further etching of the lower membrane 120, the device is placed into an oven to cure the MOS resistor paste 150.

FIGS. 2A, 2B, 3A, 3B, 4A, and 4B illustrate different example embodiments of MOS sensors. The reference numbers in these figures correspond to the reference numbers in FIGS. 1A and 1B.

Figure 4A:
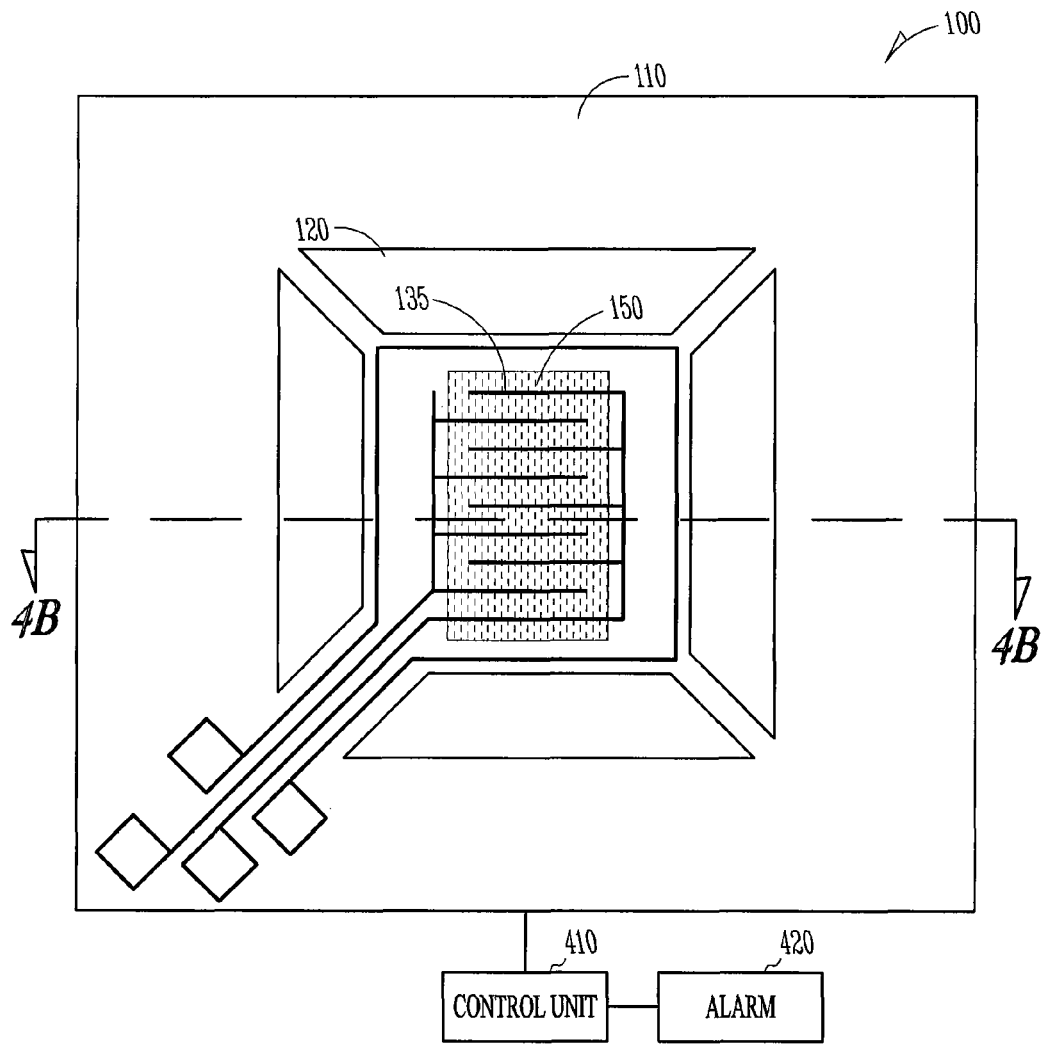
FIG. 4A is a plan view of another example embodiment of a MOS sensor.
Figure 4B:
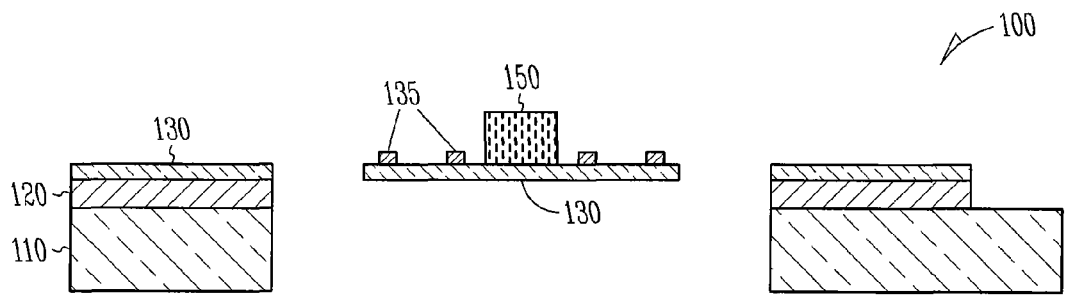
FIG. 4B is a cross sectional view along line 4B-4B of FIG. 4A.

One application of the MOS low power sensor with the sacrificial membrane is for the detection of fire in a business or home. Specifically, the constituents of the smoke generated by the fire cause an oxidation or reduction of the MOS material 150. This alters the resistance of the MOS material 150, which can be sensed by the upper thin film structure circuit 135. This information can be transmitted to a control unit 410, which can sound an alarm 420, as illustrated in FIG. 4A.

FIGS. 5A1-5A12 and FIGS. 5B1-5B12 illustrate another example embodiment of a process for fabricating a MEMS device such as a MEMS sensor. The B series figures are a 90 degree rotation of the A series figures. For ease of explanation, the process will be described in connection with the A series figures. FIG. 5A1 illustrates the starting components of a MOS device 500 including a silicon wafer base 505, a base oxide layer 510, and a mask layer 520. The silicon wafer base 505 serves as a substrate, and the base oxide layer 510 serves as a stopper layer during one or more etching steps on the fabrication process. The mask layer 520 can include titanium tungsten. The titanium tungsten can be removed (e.g., by etching holes in it) without damaging other layers of the device. The mask layer 520 would typically be in the range of 50 nm to 300 nm, so as to be sufficient to be an etch stop.

FIG. 5A2 illustrates the etching of the titanium tungsten layer. The etching creates holes 525 in the titanium tungsten layer. The etching is done down to the base oxide stop layer 510.

FIG. 5A3 illustrates the depositing of a bridge layer 530. In an embodiment, the bridge layer 530 is silicon dioxide. As illustrated in FIG. 5A3, the material used for the bridge layer 530 conformally deposits over the holes 525. The bridge layer 530 would have thicknesses in the range of 0.1 µm to 10 µm so as to provide maximum strength after patterning and minimum thermal conduction.

FIG. 5A4 illustrates the deposition of a heater or electrode layer. The layer is first deposited as a blanket layer, and then patterned into the heater or electrode elements 535. The deposited heater or electrode layer could be platinum, nickel chromium, or other suitable material.

FIG. 5A5 illustrates the etching of the silicon wafer base 505. In an embodiment, this etch is a DRIE etch, and it is performed on the underside of the device. In an embodiment, a photo resist layer is placed on the back of the silicon wafer base 505, and the photo resist layer is used as a mask to etch the silicon wafer base 505.

FIG. 5A6 illustrates the placing and alignment of a stencil 540 onto the device 500. FIG. 5A7 illustrates the stencil printing of the device 500. A blade 545 is used to deposit a MOS material 550 to the device 500 via the stencil 540. The MOS material 550 can include Chrome-titanium Oxide (CTO) or tungsten trioxide (WO3). The culmination of this application process is illustrated in FIG. 5A8. FIG. 5B8 offers a better illustration of how the MOS material 550 sits on the heater or electrode elements 535. This design then permits every other electrode element 535 to be connected to one side of the device, while the others are connected to the other side of the device. Then, in an embodiment, current can be applied to the device 500 and the resistance can be measured for the parallel paths on the device.

FIG. 5A9 illustrates the removal of the stencil 540. After the removal of the stencil 540, the device can be annealed.

FIG. 5A9 further illustrates the components 555 that make up heater elements and MOS leads. FIG. 5B9 illustrates the electrode 535 as a heat resistor, and elements 537 as interdigitated electrodes for measuring the MOS resistance. FIG. 5A11 illustrates the etching of the base oxide layer 510 to the etch stop layer. In an embodiment, the device 500 is turned upside down and etched from the back. In this step, the titanium tungsten layer will not be etched, except for the places where the holes are filled with the titanium tungsten. FIG. 5A12 illustrates the results of the etching step of FIG. 5A11. FIG. 5A11 now clearly shows the silicon base 505 that serves as an anchor for the device, the spider legs structure 545, which has thereon the conducting lines 550 for the heater, electrodes, or other type of sensors. FIG. 5A12 illustrates the removal of the stop etch layer 510 to form the final device. FIG. 5A12 further illustrates the components 560 that make up the spider legs, and the silicon dioxide bridge 565. It is noted that the diagrams are not to scale in the lateral direction. The opening in the backside of substrate 505 is between 0.5 mm and 2 mm across while the MOS sensing material 550 is only 20 μm to 400 μm across. This distance between the heated MOS material and the silicon, plus the removal of unnecessary diaphragm materials thereby leaving the spider legs, is what allows the low power operation of the sensor.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate example embodiment.

The invention claimed is:

1. A process comprising:
   forming a dual thin film structure comprising a lower membrane and an upper thin film structure, wherein the lower membrane is positioned beneath the upper thin film structure and above a substrate;
   placing an electrode on the upper thin film structure after forming the dual thin film structure, wherein the electrode is positioned above the upper thin film structure;
   applying a metal-oxide semiconductor (MOS) material onto the dual thin film structure after placing the electrode on the upper thin film structure;
   after applying the MOS material onto the dual thin film structure, etching a portion of the substrate that is below the electrode, thereby removing the substrate but not the electrode or the MOS material, wherein the etching is performed from a side of the substrate opposite the lower membrane and upper thin film structure, and wherein the substrate etching is performed prior to etching of the upper thin film structure or etching of the lower membrane;
   after etching the portion of the substrate below the electrode, using etch removal of the upper thin film structure; and
   after the etch removal of the upper thin film structure, using etch removal of the lower membrane to form a metal-oxide semiconductor (MOS) device on the upper thin film structure such that the lower membrane is removed from an area directly beneath the electrode, such that the lower membrane protects the upper film structure from one or more substrate etching processes, and such that the etch removal of the upper thin film structure and the etch removal of the lower membrane creates an open structure such that a passageway extends through the lower membrane and the upper thin film structure;
   wherein the MOS material forms a low power sensor.

2. The process of claim 1, comprising forming the dual membrane structure using one or more of silicon dioxide and silicon nitride.

3. The process of claim 1, comprising using one or more of tungsten oxide or chromium titanium oxide for the MOS material.

4. The process of claim 1, comprising forming the lower membrane such that the lower membrane comprises a thickness in the range of approximately 1 μm to approximately 100 μm.

5. The process of claim 1, comprising forming the upper thin film structure such that the upper thin film structure comprises a thickness in the range of approximately 75 nanometers to approximately 2000 nanometers.

6. The process of claim 1, comprising forming a metal layer between the lower membrane and the upper thin film structure.

7. A process comprising:
   forming a lower sacrificial masking layer on a substrate;
   forming an upper thin film structure above the lower sacrificial masking layer;
   after forming the lower sacrificial masking layer and the upper thin film structure, placing an electrode on the upper thin film structure, wherein the electrode is positioned above the upper thin film structure;
   after placing the electrode on the upper thin film structure, applying a metal oxide semiconductor (MOS) material onto the upper thin film structure;
   after applying the metal oxide material onto the upper thin film structure, etching a portion of the substrate that is below the electrode, thereby removing the substrate but not the electrode or the MOS material, wherein the etching is performed from a side of the substrate opposite the lower sacrificial masking layer and upper thin film structure, and wherein the substrate etching is performed prior to etching of the upper thin film structure or etching of the lower sacrificial masking layer;
   after etching the portion of the substrate below the electrode, using lithographic etch patterning of the upper thin film structure to form an open structure with lower thermal conductance; and
   after the lithographic etch patterning of the upper thin film structure, removing the lower sacrificial masking layer to form a metal-oxide semiconductor (MOS) device on the upper thin film structure such that the lower sacrificial masking layer protects the upper open film structure from one or more substrate etching processes before it is removed by a benign removal process that does not attack the open structure;
   wherein the MOS material forms a low power sensor.

8. The process of claim 7, comprising removing the lower sacrificial masking layer by etching the lower sacrificial masking layer.

9. The process of claim 7, comprising etching the upper thin film structure through the lower sacrificial masking layer.

10. The process of claim 7, comprising using titanium-tungsten as the lower sacrificial masking layer.

11. The process of claim 7, comprising using silicon dioxide as the upper thin film structure.

12. The process of claim 7, comprising using one or more of tungsten oxide or chromium titanium oxide for the MOS material.

13. The process of claim 7, comprising heating the MOS device to cure the MOS material.

14. The process of claim 7, wherein the MOS device comprises a MOS sensor.

15. The process of claim 7, comprising forming the lower sacrificial masking layer such that the lower sacrificial mask layer comprises a thickness in the range of approximately 50 nm to approximately 300 nm.

16. The process of claim 7, comprising forming the upper thin film structure such that the upper thin film structure comprises a thickness in the range of approximately 0.1 µm to approximately 10 µm.

17. A process comprising:
   forming a dual thin film structure comprising a lower membrane and an upper thin film structure, wherein the lower membrane is positioned beneath the upper thin film structure and above a substrate;
   after forming the dual thin film structure, placing an electrode on the upper thin film structure, wherein the electrode is positioned above the upper thin film structure;
   after placing the electrode on the upper thin film structure, applying a metal-oxide semiconductor (MOS) material onto the dual thin film structure;
   after applying the MOS material onto the dual thin film structure, etching a portion of the substrate that is below the electrode, thereby removing the substrate but not the electrode or the MOS material, wherein the etching is performed from a side of the substrate opposite the lower membrane and upper thin film structure, and wherein the substrate etching is performed prior to etching of the upper thin film structure or etching of the lower membrane;
   after etching the portion of the substrate below the electrode, using lithographic etch patterning of the upper thin film structure to form an open structure with lower thermal conductance; and
   after using lithographic etch patterning of the upper thin film structure, using etch removal of the lower membrane to form a metal-oxide semiconductor (MOS) device on the upper thin film structure such that the lower membrane protects the upper open film structure from one or more substrate etching processes before it is removed by a benign removal process that does not attack the open structure;
   wherein the MOS material forms a low power sensor.

18. The process of claim 17, comprising forming the lower membrane such that the lower membrane comprises a thickness in the range of approximately 1 µm to approximately 100 µm.

19. The process of claim 17, comprising forming the upper thin film structure such that the upper thin film structure comprises a thickness in the range of approximately 75 nanometers to approximately 2000 nanometers.

20. The process of claim 17, comprising forming a metal layer between the lower membrane and the upper thin film structure.

* * * * *